United States Patent [19]
Smith et al.

[11] Patent Number: 6,037,764
[45] Date of Patent: Mar. 14, 2000

[54] ROTATABLE MECHANICAL HOLD-DOWN FINGER FOR HOLDING A CIRCUIT BOARD IN A TEST FIXTURE

[75] Inventors: Lonnie W. Smith, Austin; James S. Bell, Cedar Park, both of Tex.

[73] Assignee: Dell U.S.A., L.P., Round Rock, Tex.

[21] Appl. No.: 08/785,498

[22] Filed: Jan. 17, 1997

[51] Int. Cl.[7] .................................................. G01R 31/02
[52] U.S. Cl. ........................................ 324/158.1; 324/758
[58] Field of Search ................................. 324/158.1, 754, 324/755, 757, 758, 761, 762, 765

[56] References Cited

U.S. PATENT DOCUMENTS

| | | | |
|---|---|---|---|
| 4,508,405 | 4/1985 | Damon et al. ............................. | 49/260 |
| 4,573,009 | 2/1986 | Fowler et al. ......................... | 324/158 F |
| 4,730,159 | 3/1988 | Collins .................................. | 324/158 F |
| 5,311,120 | 5/1994 | Bartholomew ....................... | 324/158 F |
| 5,436,567 | 7/1995 | Wexler et al. ............................ | 324/754 |
| 5,469,064 | 11/1995 | Kerschner et al. ..................... | 324/537 |
| 5,572,144 | 11/1996 | Davidson et al. ....................... | 324/755 |
| 5,892,366 | 4/1999 | Byers ....................................... | 324/758 |

*Primary Examiner*—Ernest Karlsen
*Assistant Examiner*—Russell M. Kobert
*Attorney, Agent, or Firm*—Skjerven, Morrill, MacPherson, Franklin & Friel, LLP; Stephen A. Terrile

[57] ABSTRACT

A hold-down finger for holding a circuit board in a test fixture. The hold-down finger includes an attachment portion and a finger. The attachment portion is for attaching the hold-down finger to the test fixture. The attachment portion has a central axis. The finger is coupled to the attachment portion at a location displaced from the central axis of the attachment portion. Displacing the finger from the central axis allows for the tip of the finger to be located more precisely in a radial manner about the center point of the device to hold a circuit board down against the extreme pressures of test probe springs.

23 Claims, 2 Drawing Sheets

ROTATABLE MECHANICAL HOLD-DOWN FINGER FOR HOLDING A CIRCUIT BOARD IN A TEST FIXTURE

BACKGROUND OF THE INVENTION

1. Field of the Invention

The present invention relates generally to testing printed circuit board assemblies, and more particularly to fixtures used in "bed-of-nails" type printed circuit board testing apparatus.

2. Description of the Related Art

Printed circuit boards are an increasingly common component in all types of electronic devices. These printed circuit boards are relatively easy and inexpensive to manufacture, install, and use. Printed circuit boards eliminate the need for a chassis full of loose and tangled wire connections. As a result, complex electronic equipment can be made less expensively and much more compactly.

Printed circuit boards generally include a board constructed from an insulating material such as a glass fiber reinforced epoxy resin. The board can be rigid or it can be relatively flexible. A plurality of electrically conductive circuitry tracks are formed onto the board by printing techniques. These tracks are then connected to various electrical components when the components are affixed to the printed circuit board to provide a printed circuit board assembly.

Printed circuit board assemblies require testing after the components have been affixed on the printed circuit board to determine interconnectional continuity, board functionality, and proper placement and connection of components. Several different approaches have been developed for testing printed circuit board assemblies including, for example, functional testing, in-circuit testing, and continuity testing.

A common in-circuit testing technique to individually test each of the components on a printed circuit board is a "bed-of-nails" technique. The bed-of-nails technique uses fixed position spring-loaded probes to establish an electrical contact between test points on a printed circuit board and the test equipment. The contact may alternately be against the leads of each component to access and test the individual component. The testing equipment measures an integrity parameter at each predetermined location and compares it to a standard value. In this manner, non-functioning components can be readily identified and replaced, thereby preventing an entire board from being wasted. This process works especially well for common digital integrated circuits, the tests for which can be programmed once, stored in a library, and used when needed.

Contacting the various points of the printed circuit board is typically accomplished by placing the printed circuit board on a test fixture device and bringing the printed circuit board into contact with the test probes. An electrical charge is applied at points along the circuitry, and the resulting electrical characteristics at each of the predetermined locations are measured using the probes and compared by the test equipment with the standard values.

Bed-of-nails test fixtures generally include a number of fixed-position springloaded pins (the "nails") supported within a frame (the "bed") and connected to the test equipment via individual cables. Each particular bed-of-nails fixture is specially designed and manufactured with an appropriate number of pins suitably positioned to perform specific tests on a particular type of printed circuit board. The design and manufacture of such fixtures is well established in the art. In general, when the board is first placed in the test fixture, it is not in contact with the test probes. The board is brought into contact with the test probes.

A known approach for bringing the printed circuit board into contact with the test probes is a vacuum assist method. The vacuum assist method forces connections between the printed circuit board circuitry and the circuitry of the tester bed-of-nails by creating a vacuum between the printed circuit board and the test probes. The vacuum provides the large amount of force necessary to overcome the spring pressures of a hundred or more individual probes. Most commercially available test fixtures use a partial vacuum induced in the space between the board and the test bed to bring the board into contact with the probes. To achieve this, a flexible airtight seal is provided around the board. The seal is generally provided by a rubber seal with a spring means of returning the board to the upper position when the vacuum is released.

Although the vacuum assist method is effective in holding the printed circuit boards in place, exclusive use of the vacuum assist method may cause undesired board flex. Excessive board flex is especially likely if the test probes are not evenly distributed about the total printed circuit board area. Test probe density is often higher in one area of the printed circuit board than in other areas of the printed circuit board. Board flex and subsequent associated failures can increase to a point of creating long-term reliability problems as a result of using vacuum pull down methods.

There is a trend to use mechanical hold-down fixtures to increase throughput and reliability of the bed-of-nails fixture. A mechanical hold-down fixture uses a hold-down gate, which includes a framework which is hinged and attached to a bed-of-nails fixture. The mechanical hold-down fixture pivots for inserting the printed circuit board into and removing the printed circuit board from the test fixture. The mechanical hold-down gate includes a plurality of parallel, sturdy bars. Hold-down fingers are located in channels within the bars.

The mechanical hold-down devices have built-in spacing restrictions. The width and spacing of the parallel bars define the spacing of the fingers. The width and spacing of the bars often prevent the fingers from being placed where they are desired or required for printed circuit board testing. Therefore, the mechanical hold-down devices and the fingertips thereof may not be in the desired positions to properly hold the printed circuit board in place.

SUMMARY OF THE INVENTION

It has been discovered that displacing a mechanical hold-down finger from the central axis of the hold-down unit's base advantageously allows the mechanical hold-down finger to be located at each of a plurality of selectable locations. Thus, the finger is precisely located.

In one embodiment of the invention, a hold-down finger for holding a circuit board in a test fixture includes an attachment portion and a finger. The attachment portion is for attaching the hold-down finger to the test fixture. The attachment portion has a central axis. The finger is coupled to the attachment portion at a location displaced from the central axis of the attachment portion.

In another embodiment, a test fixture for testing a circuit board includes a base and a mechanical hold-down gate. The base supports the circuit board. The mechanical hold-down gate is coupled to the base. The mechanical hold-down gate includes a plurality of hold-down fingers. Each of the plurality of hold-down fingers includes an attachment portion and a finger. The attachment portion attaches the hold-down finger to the mechanical hold-down gate at various locations. The finger is coupled to the attachment portion. The attachment portion attaches the hold-down finger to the mechanical hold-down gate so that for each one of the various locations, the mechanical hold-down finger is oriented in one of several positions radially displaced from the various locations.

In another embodiment, a hold-down finger applies pressure to a circuit board in a bed-of-nails type circuit tester. A method for locating the hold-down finger includes providing hold-down fingers attached to a mechanical hold-down gate at various locations. Each hold-down finger is attached to the mechanical hold-down gate so that for each corresponding location, the hold-down finger is oriented in one of several positions radially displaced from the corresponding location to apply pressure at a selected location on the circuit board.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the preferred embodiments. The description is intended to be illustrative of the invention and should not be taken to be limiting. Many variations, modifications, additions, and improvements may fall within the scope of the invention as defined in the claims which follow.

An improved mechanical hold-down device is capable of rotating the finger, and therefore the point or fingertip, of the device. This ability to rotate the finger allows the fingertip to be selectively located at various points some radius away from the central axis of the mechanical hold-down device where existing hold-down fingers are located. This configuration increases the options a tester has in placing the hold-down fingers on the circuit board to force the board onto the bed-of-nails.

Figure 1:
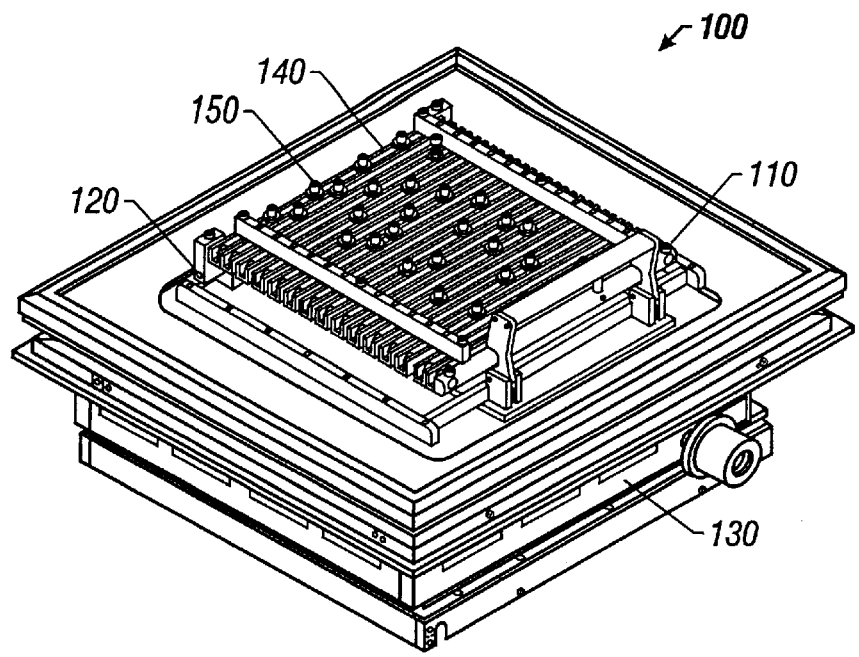
FIG. 1 shows a test fixture in accordance with an embodiment of the invention.

FIG. 1 shows bed-of-nails test fixture 100. Test fixture 100 includes base 130 and mechanical hold-down gate 110 which is hinged at hinge mechanism 120. Mechanical hold-down gate 110 pivots on hinge mechanism 120 to allow placement of the printed circuit board in test fixture 100 underneath mechanical hold-down gate 110. Mechanical hold-down gate 110 pivots to allow removal of the printed circuit board from the test fixture. Mechanical hold-down gate 110 includes parallel bars 140. Hold-down fingers 150 are mounted in mechanical hold-down gate 110. FIG. 1 shows the tops of hold-down fingers 150. A printed circuit board is placed under mechanical hold-down gate 110 on base 130 for testing. Base 130 contains springloaded test probes which contact the printed circuit board from underneath the printed circuit board. Hold-down fingers 150 hold the printed circuit board in place on the test probes.

Figure 2:
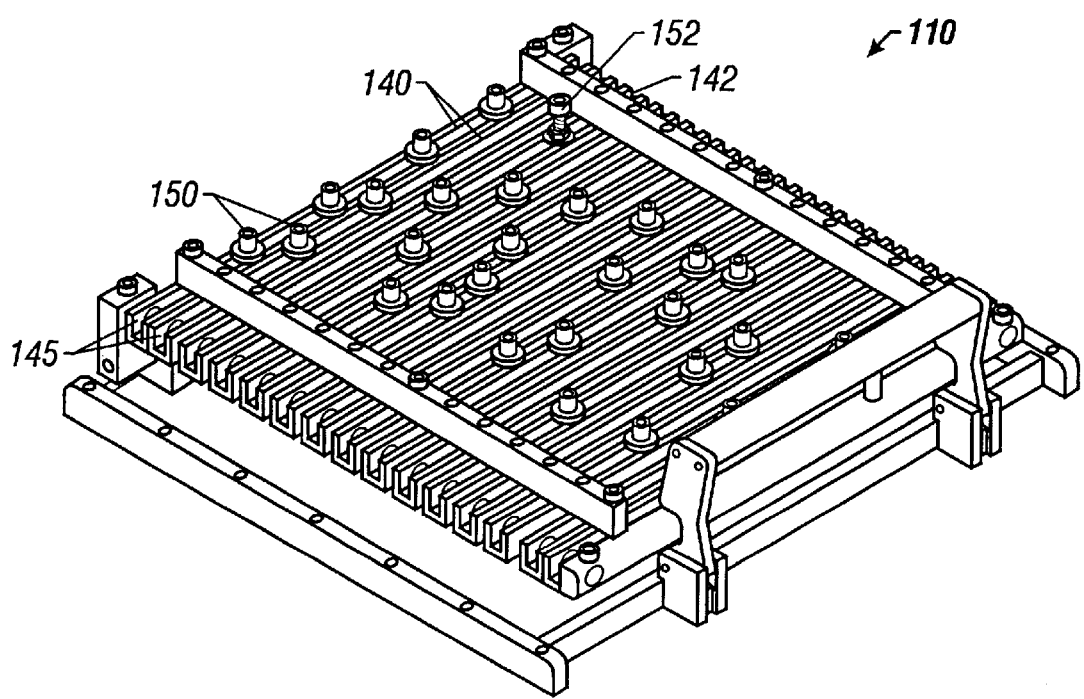
FIG. 2 shows a mechanical hold-down gate in accordance with an embodiment of the invention.

FIG. 2 shows a close-up view of mechanical hold-down gate 110. Mechanical hold-down gate 110 includes parallel bars 140. Hold-down fingers 150 are mounted on mechanical hold-down gate 110 via slots located in bars 140 at the bottom of channels 145. FIG. 2 shows the tops of hold-down fingers 150. Hold-down finger 152 is not fully installed in bar 142 of mechanical hold-down gate 110.

Figure 3:
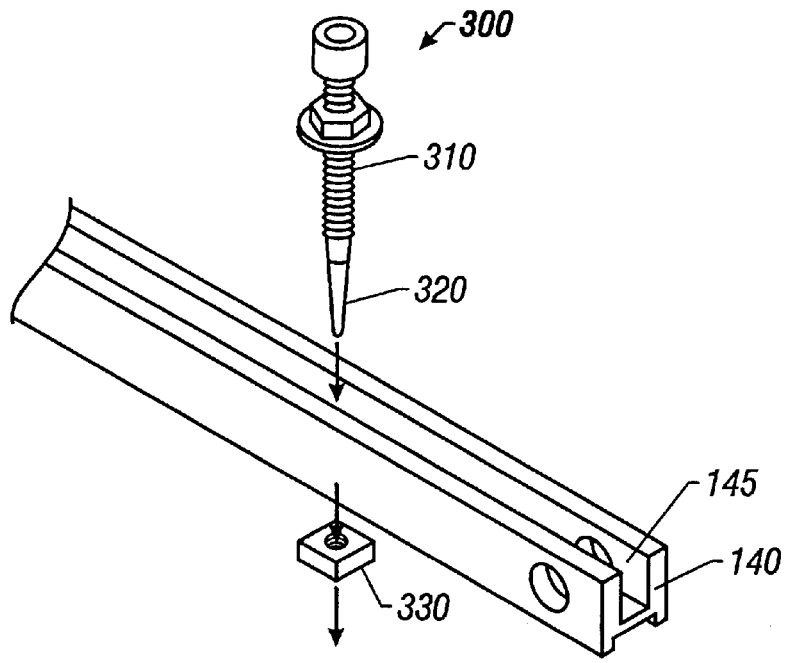
FIG. 3 shows a mechanical hold-down finger of the prior art.

FIG. 3 shows mechanical hold-down finger 300 of the prior art. Mechanical hold-down finger includes a screw portion 310, finger portion 320 and a nut 330. Referring to FIGS. 1, 2 and 3, mechanical hold-down finger 300 is placed at any point in the slot provided along the length of each of bars 140. Finger portion 320 extends perpendicularly from the underside of bar 140 downward in the central axis of mechanical hold-down finger 300. The distances between adjacent finger portions 320 on a parallel bar and the distances between finger portions 320 attached to separate and adjacent parallel bars of mechanical hold-down gate 110 are predefined as a result of this arrangement.

Figure 4:
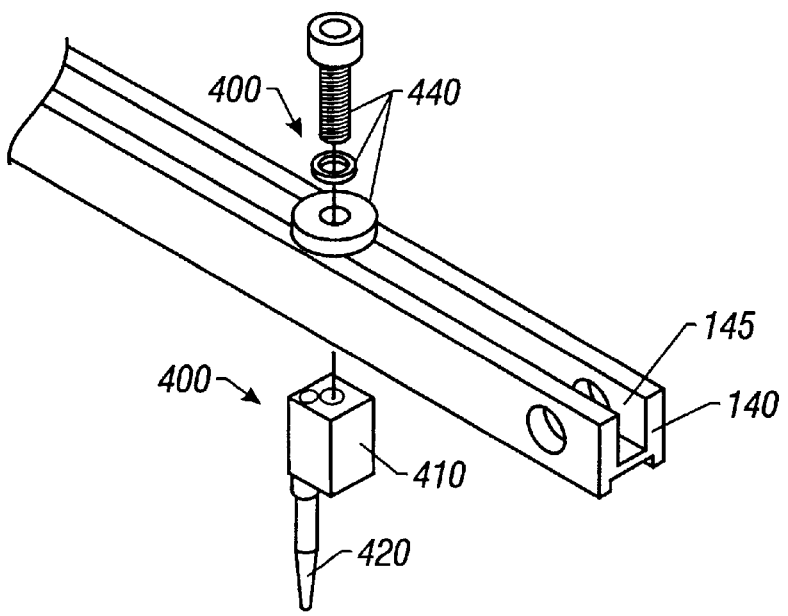
FIG. 4 shows a mechanical hold-down finger in accordance with an embodiment of the invention.

FIG. 4 shows mechanical hold-down finger 400 in accordance with an embodiment of the invention. Mechanical hold-down finger 400 includes finger block 410, finger 420 and fastening portion 440. Referring to FIGS. 1, 2 and 4, finger block 410 is placed into location holes provided in certain positions of one or more bars 140 of a mechanical hold-down gate 110. Mechanical hold-down finger 400 may be placed in test fixture 100 at any location a hold-down finger 150 may be placed.

Finger block 410 provides a means of attaching finger 420 to the bars of a test fixture. For example, finger block 410 is placed at any point in the slot provided in each of parallel bars 140. In the preferred embodiment, finger block 410 is square. In another embodiment, finger block is hexagonal. Other embodiments may be octagonal, circular, or another shape.

Finger 420 is located near a radial edge of finger block 410 on the surface that is away from the mechanical hold-down gate. In the preferred embodiment, finger 420 extends perpendicularly and downwardly from the underside face of finger block 410 from a point radially displaced from the central axis of finger block 410.

The shape of finger block 410 facilitates the positioning of finger block 410 into one of several possible rotational orientations. For example, in the preferred embodiment, a square finger block 410 may be rotated and positioned in mechanical hold-down gate 110 in any one of four positions. The position of finger 420 at a point radially distant from the central axis of finger block 410 allows finger 420 to be positioned in any one of four positions as finger block 410 is rotated. In another embodiment, a hexagonal finger block 410 may be rotated and positioned in mechanical hold-down gate 110 in any one of six positions. The consequence of the ability to rotate finger block 410, and therefore finger 420, of the improved hold-down finger, is that the tip of finger 420 can be located more precisely in a radial manner about the center point of the device to hold a printed circuit board down against the extreme pressure of the multitude of test probe springs. The rotatable mechanical hold-down finger 400 provides test fixture 100 more locations in which to place hold-down fingers 420 to hold the circuit board in place during testing The ability to rotate finger 420 three-hundred and sixty degrees about the central axis of mechanical hold-down finger 400 helps to increase spacing options in locating fingers 420. The spacing limitations presented by the nature of the width of bars 140 is now substantially overcome. The closest distance between adjacent fingers 320 is limited with fixed mechanical hold-down fingers 300; however, rotatable hold-down fingers 420 can be positioned directly adjacent to one another when using mechanical hold-down fingers 400.

Additionally, although mechanical hold-down fingers 300 normally align with each other along any one parallel bar, fingers 420 of mechanical hold-down fingers 400 can be offset from the central axes of mechanical hold-down fingers 400 to take advantage of the usable hold-down locations on the printed circuit board that may not be in direct alignment with the bars. The ideal printed circuit board locations are often not directly available and in alignment with each other. Given the spacing constraints of the mechanical hold-down fingers 300, the ideal circuit board locations are not always accessible, even between adjacent hold-down fingers 300 located on the same parallel bar. Using the improved mechanical hold-down finger 400, the circuit board testing equipment can place finger 420 atop mechanically approved devices or at other desired locations on the printed circuit board that are ordinarily not available with fixed mechanical hold-down fingers 300.

Referring to FIG. 4, mechanical hold-down finger 400 is square in shape to allow for four positions for finger 420. A square shape allows for fixing finger block 410 of the mechanical hold-down finger 400 in each of four possible preset orientations, thereby fixing finger 420 in each of four possible preset locations. Utilizing a pentagonal, hexagonal, octagonal or other shape allows for fixing the finger block 410 in each of five, six, eight or any number of possible preset ways. Alternatively, finger block 410 could be circular, or any other shape that facilitates the rotation of finger block 410, to allow more flexibility in locating finger 420. The proper shaping of finger block 410 combined with the radial offset of finger 420 provides additional design enhancement and flexibility.

While the invention has been described with reference to various embodiments, it will be understood that these embodiments are illustrative and that the scope of the invention is not limited to them. Many variations, modifications, additions, and improvements of the embodiments described are possible. Those skilled in the art will recognize that although finger block 410 and finger 420 are shown in the drawings as specific shapes, any shape is possible that facilitates the purpose of the invention. It is appreciated that mechanical hold-down finger 400 may be placed in a variety of circuit testers. It is also appreciated that finger block 410 and finger 420 may comprise separate portions of one element as well as separate elements coupled together. These and other variations, modifications, additions, and improvements may fall within the scope of the invention as defined in the claims which follow.

What is claimed is:

1. A hold-down finger for holding a circuit board in a test fixture comprising:
    an attachment portion for attaching the hold-down finger to the test fixture, the attachment portion having a central axis, and
    a finger coupled to the attachment portion at a location displaced from the central axis of the attachment portion;
    wherein the finger can be rotated about the central axis of the attachment portion to provide an increased number of placement opportunities for the finger.

2. The hold-down finger of claim 1 wherein the attachment portion comprises:
    a finger block; and
    a fastening portion.

3. The hold-down finger of claim 2 wherein the finger block has a cross section having a number of sides in the range of five to ten.

4. The hold-down finger of claim 2 wherein the finger block has a square cross section.

5. The hold-down finger of claim 2 wherein the finger block has a hexagonal cross section.

6. The hold-down finger of claim 2 wherein the finger block has a circular cross section.

7. The hold-down finger of claim 1 wherein the attachment portion comprises:
    a first surface facing the finger;
    a second surface opposite the first surface; and
    a first number of lateral surfaces between the first and second surfaces, the lateral surfaces adapted so that the hold-down finger can be placed in a fixture so that the hold-down finger can be oriented in each of a first number of orientations.

8. The hold-down finger of claim 7 wherein the first number of lateral surfaces is in the range of five to ten.

9. The hold-down finger of claim 1 wherein the hold-down finger is mounted within a bed-of-nails circuit board test fixture.

10. A test fixture for testing a circuit board, the test fixture comprising:
    a base for supporting the circuit board;
    a mechanical hold-down gate coupled to the base, the mechanical hold-down gate including a plurality of hold-down fingers, each of the plurality of hold-down fingers including
        an attachment portion for attaching the hold-down finger to the mechanical hold-down gate at a plurality of locations, and
        a finger coupled to the attachment portion, the attachment portion attaching the hold-down finger to the mechanical hold-down gate so that for each one of the plurality of locations, the mechanical hold-down finger is oriented in one of a plurality of positions radially displaced from the one of the plurality of locations.

11. The test fixture of claim 10 wherein the attachment portion comprises a finger block.

12. The test fixture of claim 11 wherein the finger block has a cross section having a number of sides in the range of two to ten.

13. The test fixture of claim 11 wherein the finger block has a square cross section.

14. The test fixture of claim 11 wherein the finger block has a hexagonal cross section.

15. The test fixture of claim 10 wherein the attachment portion comprises:
    a first surface facing the finger;
    a second surface opposite the first surface; and
    a first number of lateral surfaces between the first and second surfaces, the lateral surfaces adapted so that the hold-down finger can be placed in a fixture so that the hold-down finger can be oriented in each of a first number of orientations.

16. The test fixture of claim 15 wherein the first number of lateral surfaces is in the range of two to ten.

17. The test fixture of claim 10 wherein the hold-down finger is mounted within a bed-of-nails circuit board test fixture.

18. A method for locating a plurality of hold-down fingers, the hold-down fingers for applying pressure to a circuit board in a bed-of-nails type circuit tester, the method comprising:

providing a plurality of hold-down fingers attached to a mechanical hold-down gate at a plurality of locations, each hold-down finger attached to the mechanical hold-down gate so that for each corresponding one of the plurality of locations, the hold-down finger is oriented in one of a plurality of positions radially displaced from the one of the plurality of locations to apply pressure at a selected location on the circuit board.

19. The method of claim 18 further comprising:

providing a finger block for each of the plurality of hold-down fingers, the finger block having a cross section, the cross section having a number of sides in the range of two to ten.

20. The method of claim 19 wherein the finger block has a square cross section.

21. The method of claim 19 wherein the finger block has a hexagonal cross section.

22. The method of claim 18 further comprising:

providing a finger block for each of the plurality of hold-down fingers, the finger block having
 a first surface facing the finger;
 a second surface opposite the first surface; and
 a first number of lateral surfaces between the first and second surfaces, the lateral surfaces adapted so that the hold-down finger can be placed in a fixture so that the hold-down finger can be oriented in each of a first number of orientations.

23. The method of claim 22 wherein the first number of lateral surfaces is in the range of two to ten.

* * * * *